(12) United States Patent
Kitchener et al.

(10) Patent No.: US 9,007,069 B2
(45) Date of Patent: Apr. 14, 2015

(54) METHOD OF TESTING A SPUR SHORT CIRCUIT PROTECTION SYSTEM AND DIAGNOSTIC DEVICE FOR PERFORMING THE METHOD

(75) Inventors: Renato Kitchener, West Sussex (GB); Gunther Rogoll, Mannheim (DE)

(73) Assignee: Pepperl + Fuchs GmbH (DE)

( * ) Notice: Subject to any disclaimer, the term of this patent is extended or adjusted under 35 U.S.C. 154(b) by 317 days.

(21) Appl. No.: 13/576,834

(22) PCT Filed: Feb. 4, 2011

(86) PCT No.: PCT/GB2011/000152
§ 371 (c)(1),
(2), (4) Date: Aug. 2, 2012

(87) PCT Pub. No.: WO2011/095782
PCT Pub. Date: Aug. 11, 2011

(65) Prior Publication Data
US 2012/0299601 A1 Nov. 29, 2012

(30) Foreign Application Priority Data
Feb. 5, 2010 (GB) .................................. 1001867.9

(51) Int. Cl.
| G01R 31/02 | (2006.01) |
| H02H 9/00 | (2006.01) |
| G01R 31/28 | (2006.01) |
| H02H 3/04 | (2006.01) |
| H02H 3/05 | (2006.01) |

(52) U.S. Cl.
CPC ............ *H02H 9/008* (2013.01); *G01R 31/2827* (2013.01); *H02H 3/044* (2013.01); *H02H 3/05* (2013.01)

(58) Field of Classification Search
CPC ......... H02H 3/05; H02H 9/008; H02H 3/044; G01R 31/2827

USPC .............. 324/537–543, 415–424, 555, 750.3; 361/1, 54, 92, 115; 363/50–58
See application file for complete search history.

(56) References Cited

U.S. PATENT DOCUMENTS

| 6,369,997 B2 * | 4/2002 | Graube ........................ 361/93.9 |
| 7,876,544 B2 * | 1/2011 | Kessler et al. ................ 361/93.1 |
| 2011/0279939 A1 * | 11/2011 | Kitchener et al. .............. 361/87 |

FOREIGN PATENT DOCUMENTS

| DE | 4127392 A1 | 2/1993 |
| GB | 2238191 A | 5/1991 |
| WO | 9945621 A1 | 9/1999 |

OTHER PUBLICATIONS

International Search Report for Application No. PCT/GB2011/000152 dated May 26, 2011.
International Preliminary Report on Patentability for Application No. PCT/GB2011/000152 dated Aug. 16, 2012.

* cited by examiner

*Primary Examiner* — Arleen M Vazquez
*Assistant Examiner* — Robert P Alejnikov, Jr.
(74) *Attorney, Agent, or Firm* — Lerner, David, Littenberg, Krumholz & Mentlik, L.L.P.

(57) ABSTRACT

A method of testing a short circuit protection system applied to a spur of an electric circuit. The short circuit protection system has a current limiting means which applies a current limit to the spur if the current thereon exceeds a trip level. The electric circuit has a power supply and an isolation means adapted to fully or partially isolate the power supply from the electric circuit if the current thereon exceeds a power supply trip level for longer than a deadband period. The method includes applying a test current demand to the short circuit protection system which has a current and duration sufficient for the spur current trip level but a current insufficient to exceed the power supply trip level and/or a duration insufficient to exceed the deadband period, and detecting if the current limiting means applies the current limit or not during the test current demand.

24 Claims, 4 Drawing Sheets

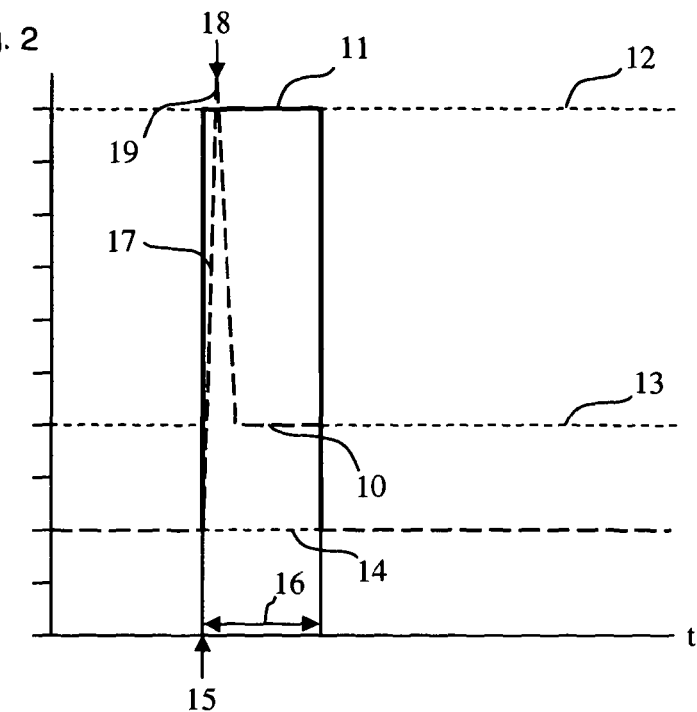
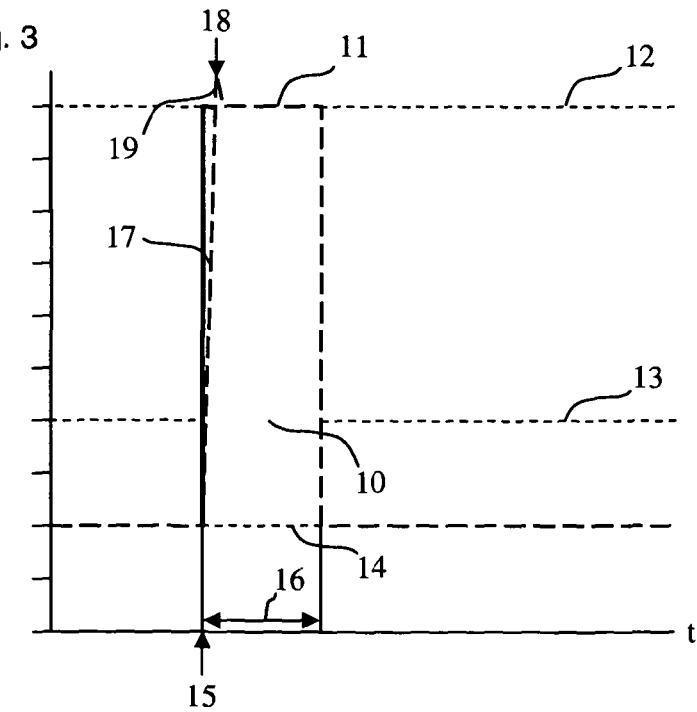

METHOD OF TESTING A SPUR SHORT CIRCUIT PROTECTION SYSTEM AND DIAGNOSTIC DEVICE FOR PERFORMING THE METHOD

CROSS-REFERENCE OF RELATED APPLICATIONS

The present application is a national phase entry under 35 U.S.C. §371 of International Application No. PCT/GB2011/000152 filed Feb. 4, 2011, published in English, which claims priority from Great Britain Patent Application No. 1001867.9, filed Feb. 5, 2010, all of which are incorporated herein by reference.

The present invention relates to a method of testing short circuit protection systems used in active device couplers, and to devices for performing the method, for use particularly, but not exclusively to test the protection systems used in Fieldbus circuits.

Fieldbus (or field bus) is the name of a family of industrial computer network protocols used for real-time distributed control, now standardized as IEC 61158. A complex automated industrial system, for example a fuel refinery, usually needs an organized hierarchy of controller systems to function. In this hierarchy there is a Human Machine Interface (HMI) at the top, where an operator can monitor or operate the system. This is typically linked to a middle layer of programmable logic controllers (PLC) via a non time critical communications system (e.g. Ethernet). At the bottom of the control chain is the fieldbus, which links the PLCs to the components which actually do the work such as sensors, actuators, electric motors, console lights, switches, valves and contactors.

Fieldbus is often used in Intrinsically Safe environments, for example combustible atmospheres, and in particular gas group classification IIC, Hydrogen and Acetylene, and below, for example gas group IIB and IIA, for gas and/or dust. Using the Fieldbus protocol, field instruments and equipment in such an environment are controlled and monitored remotely via an electrical communications circuit often provided in the same electrical circuit as the power to drive the field instruments.

In a typical Fieldbus electrical power and communications circuit there is a power supply, an Intrinsic Safety barrier of some kind, a trunk section leading out into the field, and a number of device couplers with spurs connected thereto, on which the field instruments are mounted. The trunk and the spurs together form a segment. The Intrinsic Safety barrier divides the circuit into an Intrinsically Safe side and a non-Intrinsically Safe side. The power supply, the PLCs and other systems like physical layer diagnostic modules which measure physical layer attributes of the electrical circuit and the network hardware, and in part the physical software or protocol being used, are located in the non-Intrinsically Safe side of the circuit, usually in a control room. The trunk, the device couplers, the spurs and the field instruments are located in the Intrinsically Safe side, out in the field.

Intrinsic Safety can be achieved in a number of known ways, from simply limiting the power so open or short circuits cannot form combustible arcs, to using active monitoring and isolating systems which allow higher power levels and act to isolate the power supply from open or short circuits to prevent combustible arcs.

In addition, it is also common to use current limiting protection electronics within active device couplers, which act to limit the current in a particular spur if a short circuit occurs thereon. Such spur short circuits can occur for example when there is an inadvertent cable break or make, or if a device itself fails to a short circuit state, which could result from electronic component failure or even flooding of the instrument enclosure. The current limiting electronics prevent any such faults from short circuiting the trunk. Short circuits can also occur when a device is disconnected or when errors occur during routine maintenance and calibration, so the current limiting electronics acts as a safeguard and allows for routine work to be carried out on an active spur without the danger of it effecting other parts of the circuit. The current range of two wire IEC61158 Fieldbus spur current limiting protection electronics within active device couplers includes the Segment Protector (RTM) and Spur Guard (RTM) products.

Such protection systems are accounted for in the working practice/procedure used at an instillation, as well as being included in the availability estimations for any spur. In particular the security that these protection systems offer is accounted for in the degree of availability of a given segment. Therefore, it is desirable that the protection system has a high degree of availability. However, nothing is infallible and these protection systems can fail. Spur electronic reliability is estimated to be in the region of 500 Years mean time between failures (MTBF). However, on a large site with 10,000 devices this means there could be 20 spur failures a year, and 200 over the standard project lifecycle of 10 years.

Current limiting devices like those described above comprise a series semiconductor element and a current sense/drive circuit. The circuit monitors the current on the spur, and if it reaches a trip level the semiconductor is switched to limit the current. If the semiconductor itself fails to an open circuit state then the devices on the spur will be lost, and this will be immediately detected by the main control systems and an alarm can be issued. However, if the semiconductor fails to a short circuit state, or if the sense/drive circuit fails and sets up the same effect, this will not be detected during normal operation of the spur because the protection components are not functional while the current remains below the trip point. If a short circuit then occurs on the spur the protection electronics will not limit the current, and the fault will travel to the rest of the segment. If so, the protection systems active in the trunk will function and bring down the segment. A typical segment contains four control loops and 12 instruments, and such failures occurring 20 times a year causes significant disruption. In addition to this problem, if the short circuit is applied to the trunk the power supply will be stressed before a current limit is applied. Further, the let though of the short circuit current can also inflict further damage on the internal circuitry of the spur protection electronics.

The current limiting device can also suffer other failures which are not detected until they are exposed by a secondary fault on the spur, including a current trip level deviation or a slewing in the reaction time. Either of these failures could result in the current in the spur not being limited sufficiently, or in time, to prevent the fault travelling to the trunk.

It would be theoretically possible to test a spur current limiting device by manually applying a short circuit to the spur and observing the results. Such a procedure is obviously not covered by any Fieldbus reference or application manual. If such a diagnostic procedure were performed it would have to be accepted that the applied short circuit could pull the segment down if the current limiting device was faulty. Therefore, such a procedure would have to be performed during commissioning and/or shutdown periods to prevent interruption during normal operation. Of course, field devices are regularly swapped out for calibration during normal operation, or there may be a requirement to add devices to a working segment, and if such actions resulted in a short circuit then a faulty current limiting device will be exposed in any case. If so, not only will the segment go down, but the instrument being swapped in or added will have to be mounted elsewhere—again, not knowing if an alternative spur is fully operational.

Shorting the power supply even once, whether as a result of a deliberate diagnostic short circuit or the inadvertent result of routing work, can shorten its life expectancy, even if it is designed to cope with such short circuits. Furthermore, applying a wire contact short circuit introduces contact bounce. Therefore, performing diagnostic short-circuits to functioning current limiting devices would lead to unnecessary network ringing.

However, the most important drawback of such an approach is that it would only determine a fail/no fail status. If the current limiting device did limit the current, the trip level at which it did so would not be known. This trip level could be higher or lower than the design specification, either of which could cause further problems in operation. For example, the current limiting device may trip and limit the current with lower than specified loads, or it may trip at higher than the anticipated point, creating an overloading of the power supply and/or a large voltage loss on the trunk.

In addition, with a simple fail/no fail determination the reaction time of the current limiting device would also remain unknown. A slewed reaction time could lead to an excessive and potentially destructive overshot of current before the current limit is applied after a short circuit fault.

It would be possible to test for all of the above parameters using a range of sophisticated laboratory grade test equipment and ancillary items, but this would take too much time, and it would be impractical in a hazardous area because all the equipment would have to be Intrinsically Safe.

Therefore, there is required a method of testing an IEC61158-2 and/or type FF846 Fieldbus device coupler spur protection circuit on a working system, without the potential for 'bringing down' the segment. In addition, it would be advantageous if the actual limited current could be measured, and checked against a known data base. For example, a particular model may have a current limit of 60 mA+/−10%, and if it is measured at 61 mA then a 'pass' message can be issued, including the actual current. Further, it would also be advantageous if the method could be as non-disruptive as possible, for example by avoiding any possibility of tripping the main power supply, by not leading to device brown out on the spur, and by not destroying more than one Fieldbus data telegram. The present invention is intended to address some of these issues.

Therefore, according to a first aspect of the present invention there is provided a method of testing a short circuit protection system applied to a spur of an electric circuit, in which the short circuit protection system comprises a current limiting means which applies a current limit to said spur if the current thereon exceeds a spur current trip level, in which the electric circuit comprises a power supply and an isolation means adapted to fully or partially isolate the power supply from the electric circuit if the current thereon exceeds a power supply trip level for longer than a deadband period, in which said method comprises the following steps:
  i) applying a test current demand to said short circuit protection system which has a current and duration sufficient for said spur current trip level to be exceeded, but a current insufficient for said power supply trip level to be exceeded and/or a duration insufficient to exceed said deadband period,
  ii) detecting if the current limiting means applies said current limit or not during said test current demand.

Thus, the present invention involves the application of a test current demand to simulate the effects of a short circuit fault, in order to test the operation of the current limiting means. The test current demand is controlled in its current and duration such that the power supply will not be tripped and bring down the segment, or cause other problems, as described further below.

It will be appreciated that the manner in which the test current demand is limited to avoid tripping the power supply will be determined by the characteristics of the circuit design as a whole, and also by the power supply itself and the way its isolation means operates. In a very simple example a circuit could have one spur which uses a maximum of 20 mA in normal operation, which has a current limiting means which limits the current to 40 mA when it reaches that level. The power supply could have a trip level of 90 mA, which is reached in 100 µs. The test current demand could then be designed with a limit of 40 mA, so when it is applied the combined total current demand of 60 mA exceeds the 40 mA spur current trip level/current limit, but does not reach the 90 mA power supply trip level. If the test current demand can develop the full 40 mA, and the current limiting means react and settle, all within 50 µs, then the test current demand can also be designed with this duration so it also never exceed the 100 µs before the power supply would trip.

The term "deadband" has been used above, and this is intended to refer to the period of time before any given power supply will trip, according to its various characteristics and set-up. In a simple circuit like that above this deadband could simply be the time it takes the current to develop to the power supply trip level. However, the duration of this deadband will also be determined by the level of current demanded, as the two factors effect each other. As such, the designed current of the test current demand will determine what the deadband period is, and the designer will have to factor this into his considerations.

In a typical Fieldbus circuit there could be 10 spurs operating like the simplex one described above, giving a maximum total of 200 mA in normal use, and as such the power supply may have a current trip level of 300 mA. Therefore, to avoid tripping the power supply the test current demand could be 80 mA, so when added to the 200 mA the 300 mA trip level is not breached. As above, it would also be possible to limit the duration of the test current demand such that if its injection into the circuit did raise the current level to above 300 mA (for example if current limits of 40 mA were being applied to some of the other spurs raising the current on the segment to above 220 mA), this would not last long enough for the power supply trip to activate.

However, determining the deadband before a Fieldbus power supply will trip is more complex as there are a number of factors to consider. In particular a Fieldbus circuit would have a power conditioner which would choke the current in the event of a short circuit in a decreasing manner from almost a complete choke in the first microsecond down to nothing at 500 µs. The rate of the decrease will depend on the level of current demanded, and during the time the choke limits the current to below 300 mA the power supply will not trip. In addition, the Fieldbus power supply might have a reservoir to accommodate inrush currents demanded in normal use, which could feed the current demand for up to 500 µs. Again the duration here would depend on the level of current demanded. Therefore if the test current demand is to be limited in duration to avoid breaching the deadband period, the deadband period will first have to be determined as a function of the current of the planned test current demand, and then the duration of the test current demand can be limited accordingly.

For FF846 Fieldbus type device couplers the inrush limit for a power supply is typically 80 mA for the first 500 µs per device. Therefore, in such a circuit the test current demand could safely introduce 80 mA to the trunk, for a period of 500 µs. (It could drive more because the current demand is performed in isolation to the other devices already on the segment, but 80 mA for 500 µs is an adequate for the purposes of the invention.) In practice a test current demand limited in this way would cause no more disruption than adding a 20 mA device load.

Preferably the spur can comprise one or more load devices, and the test current demand can be insufficient in duration to cause device brown out of said one or more load devices. This would most likely involve further limiting the duration of the test current demand over that described above.

If the test current demand introduced an AC/Pulse 80 mA demand for 500 µs, the down stream devices would be choked of voltage by approximately 4 volts (peak) (80 mA×50 Ohms) lower than the nominal supply voltage. Some known field devices would survive this level of brown out whereas others would not. Given that the reaction time of known current limiting devices is in the tens of microseconds domain, even accounting for the cable and the power conditioner, the test current demand can be limited to less than 100 µs in order to avoid device brown out, and still adequately carry out its function.

Preferably the electric circuit can be a communications electric circuit carrying data telegrams, and the test current demand can be insufficient in duration to interrupt more than one data telegram carried on said electric circuit. If the test current demand were limited to less than 100 µs, then this would clearly be achieved.

At the lower end of the scale the test current demand must have a duration sufficient to exceed said spur current trip level/current limit. FF846 conformance specification dictates that a current limiting device must operate within 10 µs, taking into account the reactance of the power supply inductance, the cable and of course, the terminators. However, this is not enough time to develop 80 mA, particularly when cable is involved. Therefore, a test current demand with a 10 µs duration would be too short to adequately allow the current to develop beyond the spur current trip level/current limit so a full test is carried out. It would also be too short to ignore any overshoot/undershoot in current caused by network reactance. In practice some current will come from the near terminator first, in the order of 90 mA minimum in 100 µs, with the far terminator current arriving 8 µs or so later, for the longest length of cable.

So, taking all the above requirements into consideration, the duration of a test current demand used in a typical Fieldbus circuit must practically be between 10 µs and 500 µs, and preferably between 25 µs and 50 µs. (These limits may be different for other types of circuit, which are only limited in this invention by the requirements of claim 1.)

A surge, or overshoot, current may occur on the spur for the first few microseconds or so of the test current demand, and the level of current reached at that time would obviously not be indicative of the application or not of the current limit. Therefore in a preferred method, step ii) is performed after a current overshoot allowance delay period. To safely avoid any detection being performed during an overshoot current period, this delay period can have a duration of between 10 µs and 20 µs. After such a delay the current limiting means will either have activated and the current have settled to the current limit being applied, or the current limiting means will not have activated and the current will have settled at the level of the test current demand in addition to the load, for example 100 mA, and it will be known whether the current limiting means has successfully limited the current or not.

In an alternative to the current overshoot delay period, a digital or analogue surge filter can be applied so any current above the level of the test current demand will be ignored.

The test current demand can be applied to the short circuit protection system in step i) in a square wave form. Such an approach would be the simplest one, but it could lead to current overshoot, as described above.

Therefore, in an alternative method the test current demand can be applied to the short circuit protection system in step i) in a ramped fashion. If the test current demand were ramped up over a period of between 10 µs and 20 µs, then no current overshoot or undershoot would be experienced. The injected ramp test current demand could also be ramped down at switch off, effectively making the test current demand current di/dt trapezoidal.

As referred to above, it would be advantageous to take a measurement of the actual current limit which is applied, as this may deviate from the design specification and indicate a fault. Therefore, the method can comprises the further step: iii) in the event that the current limit is applied, measuring said current limit. It would not be necessary in practice to perform two separate measurements in steps ii) and iii), rather a single current measurement can be taken, and the information gathered used to make two determinations. Initially the simple fail/no fail logic assessment of the operation or non operation of the current limiting means can be performed, and if a fail assessment is reached then no further information is required. However, if a no fail assessment is reached then the actual current limit applied can be checked for compliance with pre-determined criteria. A degree of processing of information would be required here, but the manner in which such processing can be implemented is known. For example, a simple processor can be provided with data concerning the operational parameters of the current limiting means being tested, for example that it should apply a current limit of 60 mA+/−10%, and the current measurement taken can be compared with this data, and a pass/fail determination made if the current measurement taken is within or outside of the design specification.

As referred to above, not only could a faulty current limit be applied, but there could be a delay in the reaction time of the current limiting means as the result of a fault. Therefore, the method can further comprises the step: iv) in the event that the current limit is applied, measuring the time taken for it to be applied by the current limiting means. At the simplest level an assessment can be made whether or not the current limiting means activated within the duration of the test current demand. In other words, from a simple fail assessment it can be extrapolated that the current limiting means did not function within the duration of the test current demand. For example, the current limiting means being tested may be designed to operate to full limiting capacity under all circumstances within say 20 µs and settle, so a test current demand with a duration of say 25 µs would be adequate to determine if the reaction speed of the current limiting means is within its design specification. An actual time measurement within the 25 µs test current demand could also be performed to establish if the reaction time was slewed within this time frame. Again, a degree of processing of information would be required here, but the manner in which such processing can be implemented is known. For example, a processor can be provided with data concerning the correct reaction time for the current limiting means being tested, for example 10 μs, and the point at which the current limit was applied can be measured and compared with this data, and a pass/fail determination made. Once again, this assessment can be secondary to the simple fail/no fail logic assessment of the operation or non operation of the current limiting means. If a fail assessment is reached there then no further processing is required.

As referred to above, the test current demand is preferably limited in duration such that only one data telegram is interrupted. However, preferably the method comprises the further step: v) after the test current demand has ended, not applying a further test current demand for a pre-determined delay period. This protects against consecutive test current demands being applied by an operator, which would cause multiple data telegram failures. Again, the manner in which such a delay period can be implemented electronically is known. For example, an elapsed time interlock can be provided, which could prevent a test current demand being applied again for say ten seconds or longer.

Preferably the electric circuit is a Fieldbus electric circuit conforming to the IEC 61158 standard, and the test current demand applied in step i) can be adapted to operate within the electrical characteristics of Fieldbus.

It will be appreciated that the characteristics of the test current demand will have to be designed around the type of electric circuit of which the spur forms a part. In particular, the power supply for Fieldbus typically has an inductive, high impedance characteristic, with energy storing terminators in place, and this has to be accommodated for. This would be very different to a conventional non-Fieldbus electrical system, for example a 4-20 mA emergency shut down loop (ESD) containing only one instrument or device.

The application of the test current demand can be done by creating an actual supplementary current demand which in combination with the load exceeds the spur current trip level/current limit, as described above. However, it is also possible to apply a test current demand by lowering the spur current trip level to below the quiescent load current of the spur. In other words, the test current demand can be generated by the load devices themselves. This approach would require an electronic circuit which could manipulate the spur current trip level of the current limiting means, and finds application with integrated systems, which are described further below.

The present invention also comprises a diagnostic device for carrying out the above described method. Therefore, according to a second aspect of the present invention a diagnostic device for testing a short circuit protection system applied to a spur of an electric circuit according to the method of claim 1, comprises a connection to terminals of the spur, a test current demand application means adapted to apply said test current demand, and detection means adapted to detect if the current limiting means applies said current limit or not during said test current demand.

Clearly, given the microsecond domain of the test current demand, the above method can only be carried out by electronic means specifically designed to do so. As referred to several times above, the steps of the method can be performed using known techniques and equipment, so the device of the second aspect of the present invention could be realised by the skilled person using their common general knowledge. Therefore, the device of the second aspect of the present invention will not be described in precise detail, rather the general parameters will be given.

In a preferred construction the diagnostic device can further comprise a current measuring means which in the event that the current limit is applied, is adapted to measure said current limit. In addition, the diagnostic device can further comprise a clock function adapted to measure the time taken for the current limit to be applied by the current limiting means. The manner of operation of these features and their purpose is as described above.

The diagnostic device can further comprise an interface via which operational commands are receivable in use, and data gathered transmittable in use. This could be in the form of a keypad and display for simple human interface, and/or a digital, radio or optical interface for communicating with a PLC at a higher level.

In one embodiment the diagnostic device can be a discreet apparatus selectively connectable to said spur. This would allow an operator to move around on site and selectively test separate current limiting devices. This would be a cost-effective way of performing the invention. In addition, the detection device could be incorporated in a device with multiple other diagnostic tools and functions.

In an alternative embodiment the diagnostic device can be incorporated in a device coupler along with said short circuit protection system. This would be a more effective way of implementing the invention because testing could be performed from a control room without the need to physically locate the device couplers on site. Testing could be performed daily or hourly by a PLC, and the results presented to an operator. Alarms could be issued for failures, and/or the gathered data could be compiled into useful reliability spreadsheets. However, this solution would obviously be more expensive to implement as the cost of manufacture of each device coupler would increase.

The diagnostic device, whether discreet or integral, can be provided with its own power supply independent of the power supplied to said spur. This arrangement would isolate the diagnostic device from the effects of the test current demand, for example possible device brown out. However, it would obviously be far easier to implement with a discreet battery powered device than with integral devices, as an entire secondary power supply across the whole installation would be needed.

Alternatively the diagnostic device can be powered by the same power supplied to said spur. If so, the diagnostic device can comprise a reservoir capacity adapted to prevent device brown out of the diagnostic device when said test current demand is applied in use.

As above, the test current demand application means can either generate an actual supplementary current demand which in combination with the load exceeds the spur current trip level/current limit, or it could apply a test current demand by lowering the spur current trip level to below the quiescent load current of the spur. Both of these approaches can be achieved with known technology.

Embodiments of the present invention will now be described by way of example and with reference to the accompanying drawings, in which:

FIG. 2 is a graph illustrating spur current over time when the method according to the first aspect of the present invention is carried out on a healthy spur;

FIG. 3 is a further graph illustrating spur current over time when the method according to the first aspect of the present invention is carried out on a faulty spur;

Figure 1:
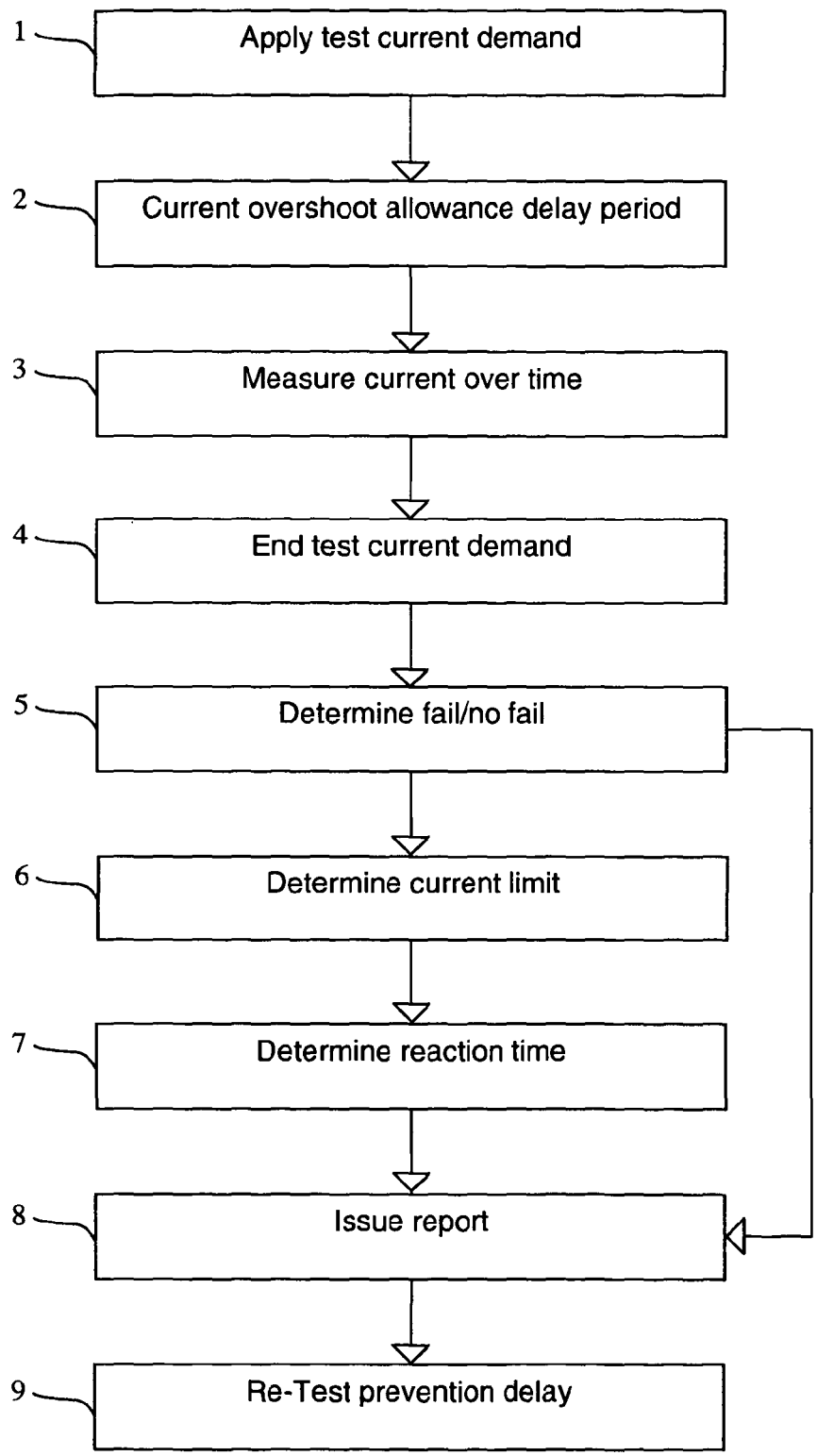
FIG. 1 is a flow chart showing the steps of the method according to the first aspect of the present invention.

FIG. 1 shows the principal steps in a method of testing a short circuit protection system applied to a spur of an electric circuit, according to the first aspect of the present invention. As described further below this method is for testing a short circuit protection system comprising a current limiting means with a spur current trip level/current limit of 40 mA, and in which the electric circuit comprises a power supply and an isolation means adapted to fully or partially isolate the power supply from the electric circuit if the current thereon exceeds a power supply trip level of 300 mA for longer than a deadband period, which in this example embodiment is 500 μs as a result of the power supply being provided with a reservoir to cope with inrush currents in normal use. The power supply trip level is set at 300 mA in this example because the power supply supplies 10 spurs, including the one referred to above, which each have a maximum load of 20 mA in use. The method shows at a first step 1 the application of a test current demand to the short circuit protection system. In this case the test current demand injects a 80 mA demand onto the spur with a 50 μs duration. Therefore in this instance the test current demand has a current and duration sufficient for the spur current trip level/current limit of 40 mA to be exceeded, but a current of 80 mA, which when added to the maximum 200 mA segment load is insufficient for the power supply trip level of 300 mA to be exceeded. It also has a duration insufficient to exceed said deadband period of 500 μs. The method also shows at a third and firth steps 3 and 5 detecting if the current limiting means applies said current limit or not during said test current demand, by means of measuring the current over time in the third step 3, and determining a fail/no fail status at the fifth step 5.

The method shown in FIG. 1 comprises further steps than those outlined above. In particular, at a second step 2 there is a current overshoot allowance delay period of 10 μs to allow for any current overshoot to elapse before measurements are taken. After such a delay the current limiting means will either have activated and the current have settled to the 40 mA current limit being applied (or a faulty current limit between 20 mA and 100 mA), or the current limiting means will not have activated and the current will have settled at the 100 mA level of the load and test current demand.

The third step 3 is then performed, and the current level is measured from the 10 μs point to the 50 μs point when the test current demand ends, at the fourth step 4.

The measured current is then processed at step 5. Initially a basic fail/no fail assessment is made on the basis of whether or not the measured current is at 100 mA at the 50 μs point. This would indicate that the current limiting means has not activated successfully by the end of the test. If this is so, the method jumps from the fifth step 5 to the eighth step 8, where a report on the failure of the current limiting means is issued.

If however the measured current is less than 100 mA at the 50 μs point the method moves to the sixth step 6, where the measured current is processed to determine if the current limit applied is within the tolerances of the design specification of the current limiting means. In this case the current limiting means is designed to limit the current to 40 mA+/−10%. Therefore if the measured current is between 36 mA and 44 mA at the 50 μs point then it can be determined that the current limiting means is operating within its design specification. If however the measured current is between 20 mA and 35 mA, or between 45 mA and 100 mA at the 50 μs point, it can be determined that the current limiting means is not operating within its design specification, and this information is included in the report issued at the eighth step 8, and appropriate remedial action taken if considered necessary.

The method then moves to the seventh step 7, where the measured current over time is processed to determine if the current limit was applied within the correct time frame according to the design specification of the current limiting means. In this case the current limiting means is designed to limit the current after 10 μs. Therefore, if the measured current remained at the 100 mA level of the load and test current demand for a period of time after the measurement was begun at the 10 μs point, the measured current over time will indicate this, as well as at what point the current dropped from the 100 mA level to the applied current limit, whatever that was. Once again, this information is included in the report issued at the eighth step 8, and appropriate remedial action taken if considered necessary.

In a ninth step 9 a re-test prevention delay is implemented to stop a further test being carried out for 10 seconds. This protects against consecutive test current demands being applied by an operator, which would cause multiple data telegram failures in use.

Referring now to FIG. 2, this shows the spur current I over time t when the method described above is performed. The actual current of the spur is indicated by dashed line 10, and the square form 80 mA test current demand is indicated by solid line 11. The levels of the 80 mA test current demand plus the 20 mA load, the 40 mA applied current limit and the 20 mA quiescent current of the spur are illustrated by hashed lines 12, 13 and 14 respectively.

The spur current is at 20 mA before the test current demand 11 is applied at point 15 and immediately demands 80 mA of current. The test current demand 11 has a duration of 50 μs, as indicated by arrow 16. This injected test current demand is restricted to 80 mA by the use of a constant current limit, ideally with an impedance of 3 kOhms or higher when in active current limiting.

As is clear from FIG. 2, the 80 mA of injected current exceeds the 40 mA spur current trip level/current limit 13 when added to the 20 mA load, and therefore the spur current 10 quickly rises well above this limit 13 once the test current demand 11 is applied. The current 10 rises in a slightly slewed manned, as indicated at 17, as it takes time for the current on the spur to develop. There is a delay before the current limiting means reacts, at point 18, and the spur current then settles to the applied current limit of 40 mA. The delay between points 15 and 18 is 10 μs, as determined by the design specification of the current limiting means.

There is a degree of overshoot above 100 mA in the spur current 10 initially, as indicated at 19, as the current limit applied to the test current demand also takes 10 μs or more to react.

As described above, the spur current 10 is measured over time from 10 μs to the end point at 50 μs. In the case of the spur current 10 shown in FIG. 2, this measurement will show a constant current of 40 mA, and therefore a current of less than 100 mA at the 50 μs point. It will therefore be determined in the fifth step 5 described above that the current limiting means is functioning. In the sixth 6 and seventh 7 steps it will then be determined from the constant 40 mA current that the current limit and reaction time are both within the design specification.

Figure 4:
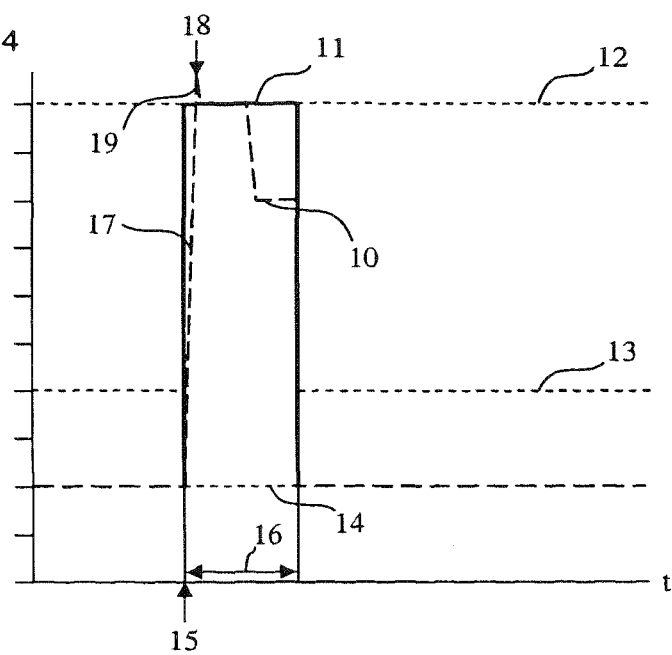
FIG. 4 is a further graph illustrating spur current over time when the method according to the first aspect of the present invention is carried out on another faulty spur.

FIGS. 3 and 4 shows further graphs like that shown in FIG. 2, except that in these cases the current limiting means is faulty. The reference numerals of FIG. 2 are used for like features in FIGS. 3 and 4. In FIG. 3 the spur current 10 simply rises to the 100 mA level of test current demand 11 and the load, and stays there for the duration of the test. Therefore, the spur current measured from the 10 μs point to the end point at 50 μs will show a constant current of 100 mA, and therefore a current of 100 mA at the 50 μs point. It will therefore be determined in the fifth step 5 that the current limiting means is not functioning at all.

In FIG. 4 the spur current 10 initially settles at 100 mA, before dropping to 80 mA after 30 μs. Therefore, the spur current measured from the 10 μs point to the end point at 50 μs will show a current of less than 100 mA at the 50 μs point. It will therefore be determined in the fifth step 5 that the current limiting means is functioning. However, in the sixth 6 and seventh 7 steps it will then be determined that the applied current limit of 80 mA is outside the design specification, and also that the reaction time of 30 μs is outside the design specification. The report issued at the eighth step 8 can indicate these failures.

In FIGS. 2 to 4 the test current demand 11 has a square wave form, which results in the overshoot 19. In an alternative approach, not shown, the test current demand can be ramped up over a period of between 10 μs and 20 μs, to prevent any overshoot from occurring. The current demand could also be ramped down at the end point, giving the current demand trapezoidal in form.

In the above examples there is a load of 20 mA on the spur, and the determinations reached during the method are based on this being the case, for example determining if the current limiting means has activated at the 50 μs point by checking whether the measured spur current is 100 mA or not depends on the load being 20 mA. Therefore, the load current of the spur will need to be determined prior to the test being carried out. In addition, if the application of the test current demand will have an impact on the current demanded by the load then this must also be taken into account in the calculations.

It should also be noted that the test current demand of 80 mA is also sufficient to exceed the spur current trip level/current limit of 40 mA if no load were present, and this is deliberate. If the test current demand were less than the spur current trip level/current limit then the test would not work if no load were present.

In the examples shown in FIGS. 2 to 4 the spur is part of a Fieldbus circuit, and comprises a plurality of load devices. The 50 μs duration of the test current demand 11 is such that none of the load devices suffers any device brown out. In addition, as part of their function the load devices send data telegrams over the circuit to PLCs at the power supply end. The 50 μs duration of the test current demand 11 is insufficient to interrupt more than one of these data telegrams. Due to the ninth step 9 the gap before another test current demand can be applied is long enough to prevent a sequence of disruptive data telegram interruptions.

Figure 5:
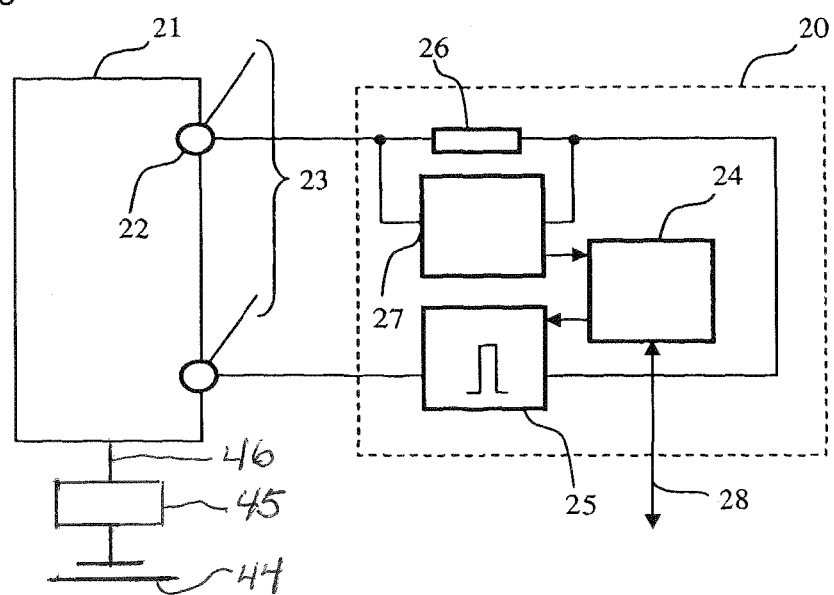
FIG. 5 is a diagrammatic view of a diagnostic device according to the second aspect of the present invention.

Referring now to FIG. 5, this shows one possible schematic arrangement of a discreet diagnostic device 20 for carrying out the method described above. FIG. 5 shows a power supply 44, an active monitoring and isolating system 45 and a trunk section 46 leading to a device coupler 21 with spur connection terminals 22 leading to a device load 23 in normal operation. The diagnostic device 20 comprises a control processor 24, a test current demand generating apparatus 25, a current sense resistor 26, current measurement electronics 27 and an interface 28. The diagnostic device 20 in this case is powered by its own internal power supply.

In use the diagnostic device 20 is connected to the spur connection terminals 22, or to a secondary set of linked terminals (not shown). As shown the connection to the spur is in parallel with the connection to the device load 23, and the connection to the spur is rendered intrinsically safe in any of the known ways. The interface 8 comprises a keypad and display, which allows an operator to command the initiation of a test current demand like that described above. The test current demand generating apparatus 25 then injects the 80 mA test current demand onto the spur for the 50 μs duration. The current measurement electronics 27 measures the current on the spur between the 10 μs point and the 50 μs point, and provides this information to the control processor 24. The control processor 24 then determines from the provided data if the current limiting means being tested is faulty or not, and provides the relevant information to the operator via the display.

Figure 6:
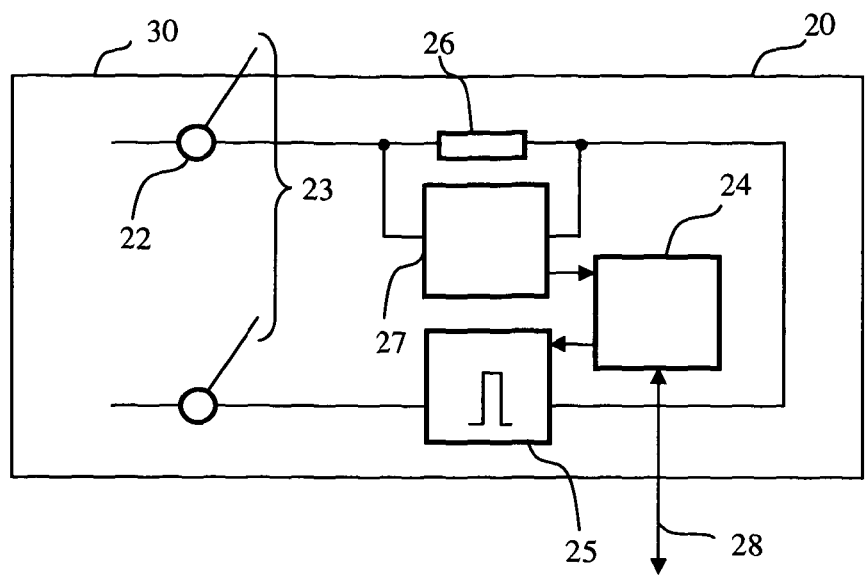
FIG. 6 is a diagrammatic view of a second diagnostic device according to the second aspect of the present invention.

The same diagnostic tool can also be integrated within a device coupler 30, as illustrated in FIG. 6. The reference numerals of FIG. 5 are used for like features in FIG. 6. With this arrangement automatic remote testing can be carried out from a control room via the interface 28, which in this case can comprise any known remote communications system. (Local testing can also be carried out via a keypad on the device coupler itself, which also forms a part of the interface 28.) Thus the report generated in use can be sent directly to a control room operator in any of the known ways, including via Fieldbus telegram, digital transmission, physical layer changes detectable at the control room end, wireless communication, optical link, or a local visual or audio annunciation. In this embodiment the diagnostic device 20 takes current from the spur for its own internal circuitry. Therefore, this current is provided with a reservoir capacity to prevent any short term black or brown out effecting the diagnostic device 20 during its operation.

The present invention can be altered without departing from the scope of claim 1 or 16. In particular, in one alternative embodiment (not shown) a diagnostic device 20 like that shown in FIG. 6 is multiplexed to cover a plurality of spurs, so the component count is minimised.

In an alternative method to that described above, instead of injecting a test current demand onto the spur which exceeds the spur current trip level/current limit, this level itself is electronically lowered to below the normal operating current of the spur. In other words, the test current demand is actually provided by the normal load devices rather than by injecting an additional test current demand. All other aspects of the method described above would be employed here, in particular the duration of the test, and the measuring of the current over time to determine the applied current limit (as adjusted) as well as the reaction time. This method could be realised with an integrated diagnostic device like that described above. The sense resistor, or a critical part of the sense/drive circuit of the current limiting means is overridden electronically so the spur current trip level/current limit is brought below the quiescent current of the spur. However, this approach would require a device load to be attached to the spur, which is not always the case. A load could be introduced for the purposes of the test, but this would increase complexity.

Therefore, the present invention provides a method for testing an IEC61158-2 and/or type FF846 Fieldbus device coupler spur protection circuit on a working system, which will not bring down the segment. In addition, the actual limited current and the reaction time of the current limiting means are determined so further useful diagnostics is performed. In addition, the method is non-disruptive as it will not trip the main power supply, it will not force field instruments into brown out and it will not destroy more than one data telegram at a time.

The invention claimed is:

1. A method of testing a short circuit protection system applied to a spur of an electric circuit, in which the short circuit protection system comprises a current limiting device comprising a series semiconductor element and a current sense/drive circuit, which current limiting device applies a current limit to said spur if the current thereon exceeds a spur current trip level, in which the electric circuit comprises a power supply and an active monitoring and isolating system which fully or partially isolates the power supply from the electric circuit if the current thereon exceeds a power supply trip level for longer than a deadband period, in which said method comprises the following steps:

i) applying a test current demand to said short circuit protection system which has a current and duration sufficient for said spur current trip level to be exceeded, but a current insufficient for said power supply trip level to be exceeded and/or a duration insufficient to exceed said deadband period, ii) detecting if the current limiting device applies said current limit or not during said test current demand.

2. A method according to claim 1, in which said spur comprises one or more load devices, and in which said test current demand is insufficient in duration to cause device brown out of said one or more load devices.

3. A method according to claim 2 in which said electric circuit is a communications electric circuit carrying data telegrams, and in which said test current demand is insufficient in duration to interrupt more than one data telegram carried on said electric circuit.

4. A method according to claim 1 in which the test current demand is applied during step i) for a duration of between 10 μs and 500 μs.

5. A method according to claim 4 in which the test current demand is applied during step i) for a duration of between 25 μs and 50 μs.

6. A method according to claim 1 in which step ii) is performed after a current overshoot allowance delay period.

7. A method according to claim 6 in which said current overshoot allowance delay period has a duration of between 10 μs and 20 μs.

8. A method according to claim 6 in which the test current demand is applied to the short circuit protection system in step i) in a square wave form.

9. A method according to claim 6 which comprises the further step: iii) in the event that the current limit is applied, measuring said current limit.

10. A method according to claim 1 in which the test current demand is applied to the short circuit protection system in step i) in a ramped fashion.

11. A method according to claim 10 in which the test current demand is ramped up over a period of between 10 μs and 20 μs.

12. A method according to claim 1 which comprises the further step: iv) in the event that the current limit is applied, measuring the time taken for it to be applied by the current limiting means.

13. A method according to claim 1 which comprises the further step: v) after the test current demand has ended, not applying a further test current demand for a pre-determined delay period.

14. A method according to claim 1 in which the electric circuit is a Fieldbus electric circuit confirming to the IEC 61158 standard, and in which said test current demand applied in step i) is adapted to operate within the electrical characteristics of Fieldbus.

15. A method according to claim 1 in which said spur comprises one or more load devices, and in which step i) is performed by electronically reducing said spur current trip level to below the quiescent current of the spur.

16. A diagnostic device for testing a short circuit protection system applied to a spur of an electric circuit, wherein the short circuit protection system comprises a current limiting device comprising a series semiconductor and a current sense/drive circuit which current limiting device applies a current limit to a connection to terminals of said spur if the current thereon exceeds a spur current trip level, and wherein the electric circuit comprises a power supply and an active monitoring and isolation system which fully or partially isolates the power supply from the electric circuit if the current thereon exceeds a power supply trip level for longer than a deadband period, the diagnostic device comprising:

i) a current demand application device for applying a test current demand to said short circuit protection system which has a current and duration sufficient for said spur current trip level to be exceeded, but a current insufficient for said power supply trip level to be exceeded and/or a duration insufficient to exceed said deadband period; and ii) a detection device for detecting if the current limiting device applies said current limit or not during said test current demand.

17. A diagnostic device as claimed in claim 16 in which the diagnostic device further comprises a current measuring means which in the event that the current limit is applied, is adapted to measure said current limit.

18. A diagnostic device as claimed in claim 17 in which the diagnostic device further comprise a clock function adapted to measure the time taken for the current limit to be applied by the current limiting means.

19. A diagnostic device as claimed in claim 16 in which the diagnostic device further comprises an interface via which operational commands are receivable in use, and data gathered transmittable in use.

20. A diagnostic device as claimed in claim 16 in which the diagnostic device is a discreet apparatus selectively connectable to said spur.

21. A diagnostic device as claimed in claim 20 in which the diagnostic device is provided with its own power supply independent of the power supplied to said spur.

22. A diagnostic device as claimed in claim 20 in which the diagnostic device is powered by the same power supplied to said spur.

23. A diagnostic device as claimed in claim 22 in which the diagnostic device comprises a reservoir capacity adapted to prevent device brown out of the diagnostic device when said current demand is applied in use.

24. A diagnostic device as claimed in claim 16 in which the diagnostic device is incorporated in a device coupler along with said short circuit protection system.

* * * * *